(12) United States Patent
Fisher et al.

(10) Patent No.: US 7,589,592 B2
(45) Date of Patent: Sep. 15, 2009

(54) SYSTEM AND METHOD FOR PRE-CHARGING A CURRENT MIRROR

(75) Inventors: Robert Michael Fisher, Center Point, IA (US); Michael L. Hageman, Mount Vernon, IA (US); David S. Ripley, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 11/930,572

(22) Filed: Oct. 31, 2007

(65) Prior Publication Data
US 2008/0100382 A1 May 1, 2008

Related U.S. Application Data

(60) Provisional application No. 60/855,517, filed on Oct. 31, 2006.

(51) Int. Cl.
*H03F 3/04* (2006.01)
(52) U.S. Cl. ........................................ 330/288; 327/535
(58) Field of Classification Search ................. 330/288; 320/166; 327/535, 558
See application file for complete search history.

(56) References Cited

U.S. PATENT DOCUMENTS

| 6,154,065 A | 11/2000 | Komatsu | |
|---|---|---|---|
| 7,030,688 B2 * | 4/2006 | Dosho et al. | ................ 327/558 |

* cited by examiner

*Primary Examiner*—Robert Pascal
*Assistant Examiner*—Hieu P Nguyen (57) ABSTRACT

A system for pre-charging a current mirror includes a controller configured to provide a first current and an additional current to a current mirror to rapidly charge a capacitance associated with the current mirror based on a reference voltage.

18 Claims, 10 Drawing Sheets

SYSTEM AND METHOD FOR PRE-CHARGING A CURRENT MIRROR

CROSS-REFERENCE TO RELATED APPLICATION

This application claims priority to co-pending U.S. provisional application entitled, "CURRENT MIRROR FAST PRE-CHARGE WITH LOCKOUT," having Ser. No. 60/855,517, filed on Oct. 31, 2006, and which is entirely incorporated herein by reference.

BACKGROUND

There are many systems that use a current mirror as part of a circuit. A current mirror typically includes a pair of transistor devices coupled together such that the current through one of the devices matches, or mirrors the current in the other device. A current mirror is typically used as a current regulator.

A current mirror may have many applications, a particular application being in a power amplifier. A power amplifier may be used in a variety of devices including, for example, a cellular telephone or other portable wireless communication device. When employed as a power amplifier in a portable communication device, current mirrors provide bias for a series of amplification stages of the power amplifier. In order to enable each current mirror, a reference current is used to charge a capacitance associated with each current mirror. However, in many power amplification applications a large capacitance is desired to meet stability and noise performance of the power amplifier. Unfortunately, the large capacitance gives rise to a slow enable time because a relatively small current must charge a relatively large capacitance to the bias point of the current mirror before the current mirror if fully activated.

Therefore, it would be desirable to have a way of rapidly biasing a current mirror that has a relatively large capacitance.

SUMMARY

Embodiments of the invention include a system for pre-charging a current minor including a controller configured to provide a first current and an additional current to a current mirror to rapidly charge a capacitance associated with the current mirror based on a reference voltage.

Related systems and methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a power amplifier used in a portable transceiver, the system and method for pre-charging a current mirror can be implemented in any system that uses a current mirror in which a fast turn-on time is desired.

The system and method for pre-charging a current mirror can be implemented in hardware, software, or a combination of hardware and software. When implemented in hardware, the system and method for pre-charging a current mirror can be implemented using specialized hardware elements and logic. When the system and method for pre-charging a current mirror is implemented partially in software, the software portion can be used to control components in the power amplifier control element so that various operating aspects can be software-controlled. The software can be stored in a memory and executed by a suitable instruction execution system (microprocessor). The hardware implementation of the system and method for pre-charging a current mirror can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for pre-charging a current mirror comprises an ordered listing of executable instructions for implementing logical functions, and can be embodied in any computer-readable medium for use by or in connection with an instruction execution system, apparatus, or device, such as a computer-based system, processor-containing system, or other system that can retrieve the instructions from the instruction execution system, apparatus, or device and execute the instructions.

In the context of this document a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory EPROM or Flash memory), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
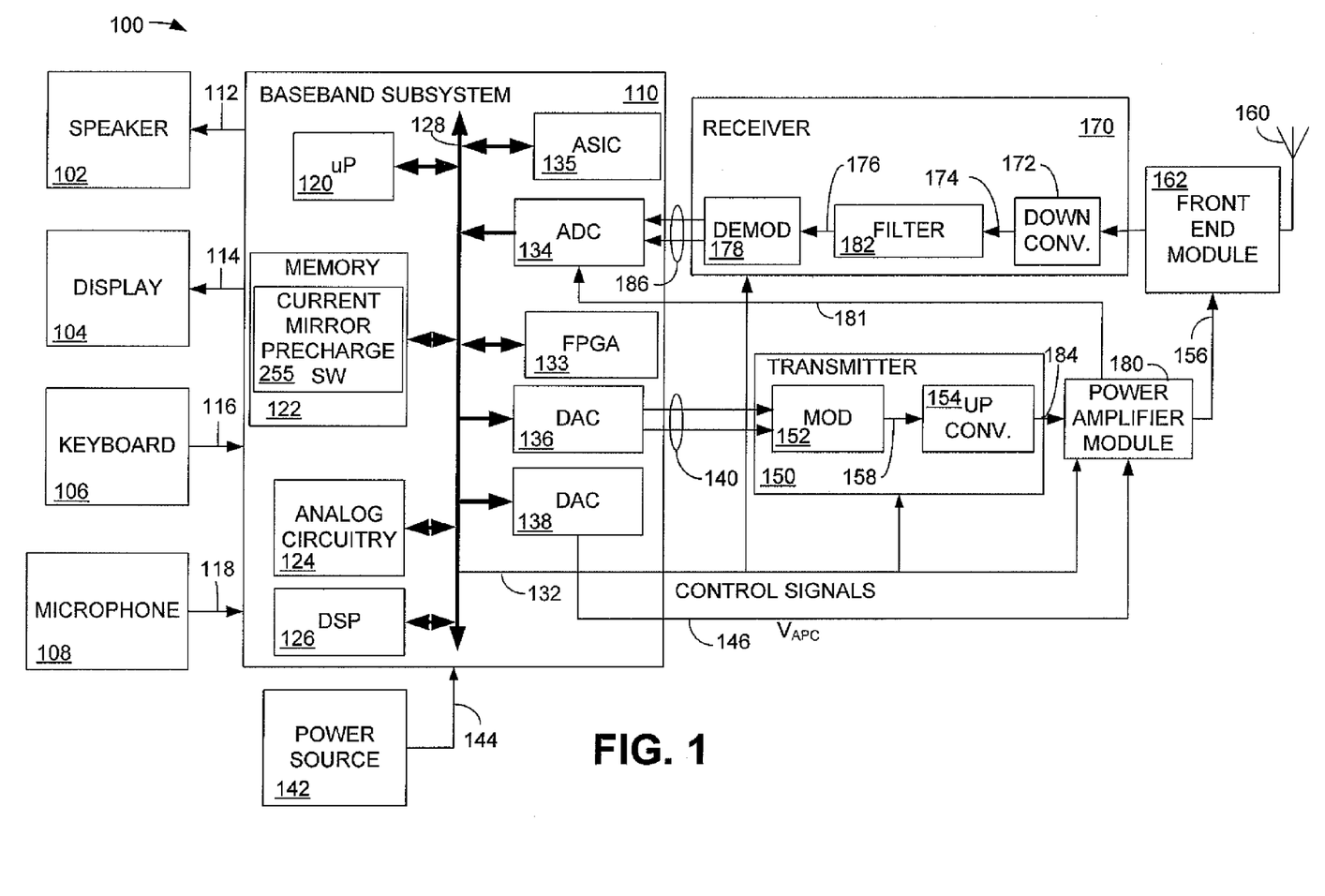
FIG. 1 is a block diagram illustrating a simplified portable transceiver including an embodiment of a system and method for pre-charging a current mirror.

FIG. 1 is a block diagram illustrating a simplified portable transceiver 100 including an embodiment of a system and method for pre-charging a current mirror. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the system and method for pre-charging a current mirror is implemented, the baseband subsystem 110 may also include an application specific integrated circuit (ASIC) 135 and a field programmable gate array FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170 and the power amplifier module 180, such as through connection 132 for example.

The baseband subsystem 110 generates a power control signal, referred to as $V_{APC}$ which is supplied to the power amplifier module 180 via connection 146. The signal $V_{APC}$ is generated by the baseband subsystem 110 and is generally converted to an analog control signal by one of the digital-to-analog converters (DACs) 136 or 138 to be described below. The power control signal $V_{APC}$ may also be supplied from the bus 128 to indicate that the signal may be generated in different ways as known to those skilled in the art. Generally, the power control signal, $V_{APC}$, is generated in the baseband subsystem 110 and controls the output of the power amplifier as a function of the peak voltage of the power amplifier determined during calibration, and corresponds to power amplifier output power.

The control signals on connections 132 and 146 may originate from the DSP 126, the ASIC 135, the FPGA 133, from microprocessor 120, or may be generated on the transmitter 150, the receiver 170 or on a transceiver chip, on which the transmitter 150 and receiver 170 are located, and are supplied to a variety of connections within the transmitter 150, receiver 170 and the power amplifier module 180. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

If portions of the system and method for pre-charging a current mirror are implemented in software that is executed by the microprocessor 120, the memory 122 will also include current mirror pre-charge software 255. The current mirror pre-charge software 255 comprises one or more executable code segments that can be stored in the memory and executed in the microprocessor 120. Alternatively, the functionality of the current mirror pre-charge software 255 can be coded into the ASIC 135 or can be executed by the FPGA 133, or another device. Because the memory 122 can be rewritable and because the FPGA 133 is reprogrammable, updates to the current mirror pre-charge software 255 can be remotely sent to and saved in the portable transceiver 100 when implemented using either of these methodologies. If portions of the system and method for pre-charging a current mirror are implemented in software, then a feedback signal from the power amplifier module 180 to the bus 128, typically via the ADC 134 via connection 181 will be provided to sense whether there is a need for current mirror pre-charge.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to the power amplifier module 180 via connection 184. The power amplifier module 180 contains one or more power amplifiers that amplify the signal to an appropriate power level for the system in which the portable transceiver 100 is designed to operate. Details of the structure and operation of the power amplifier module 180 are described below.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation application such as the global system for mobile communications (GSM), the phase modulated information is provided by the modulator 152. When the power amplifier module is used in an application requiring both phase and amplitude modulation such as, for example, extended data rates for GSM evolution, referred to as EDGE, the cartesian in-phase (I) and quadrature (Q) components of the transmit signal are converted to their polar counterparts, amplitude and phase. The phase modulation is performed by the modulator 152, while the amplitude modulation is performed by elements of a power amplifier control element, where the amplitude envelope is defined by a power amplifier power control voltage $V_{APC}$, which is generated by the power amplifier control element. The instantaneous power level of the power amplifier module 180 tracks $V_{APC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier module 180 supplies the amplified signal via connection 156 to a front end module 162. The front end module 162 comprises an antenna system interface that may include, for example, a diplexer having a filter pair that allows simultaneous passage of both transmit signals and receive signals, as known to those having ordinary skill in the art. In an embodiment, the power amplifier module 180 and the front end module 162 may be combined into a single element. The transmit signal is supplied from the front end module 162 to the antenna 160.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
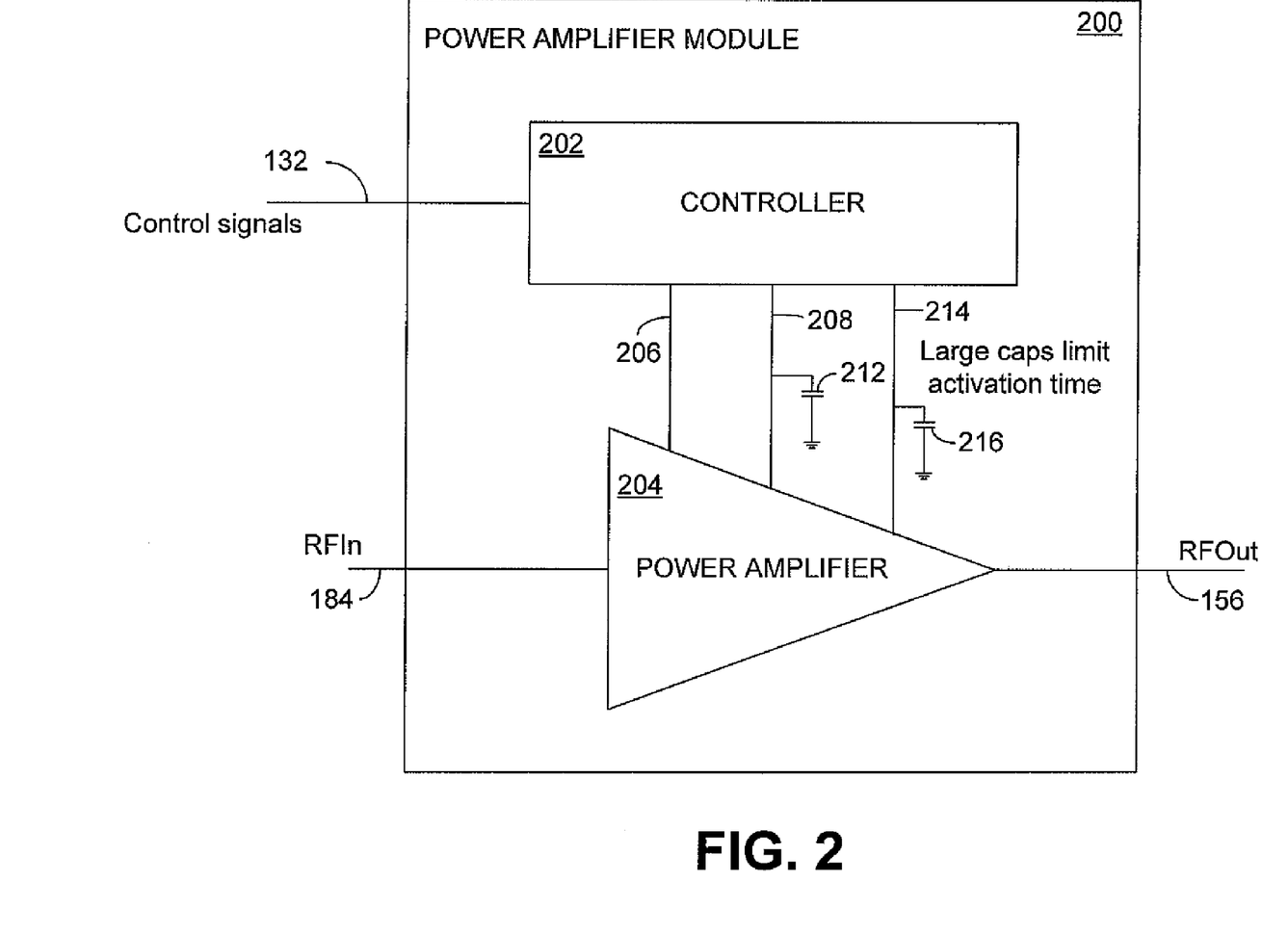
FIG. 2 is a block diagram illustrating the power amplifier module of FIG. 1 in greater detail.

FIG. 2 is a block diagram illustrating the power amplifier module of FIG. 1 in greater detail. The power amplifier module is referred to using reference numeral 200 in FIG. 2. The power amplifier module 200 is illustrated to explain the system and method for pre-charging a current mirror and may include other elements (not shown). The power amplifier module 200 includes a controller 202 and a power amplifier 204. Although illustrated as a single power amplifier, the power amplifier 204 may comprise multiple iterations of power amplifiers, and may also include multiple power amplifier stages. A reference voltage is provided from the power amplifier 204 to the controller 202 via connection 206. The connections 208 and 214 between the controller 202 and the power amplifier 204 illustrate the control signals to multiple stages of the power amplifier 204 from the controller 202. In this example, large capacitances 212 and 216, associated with the connections 208 and 214, respectively, limit the turn on time of the current mirrors within the power amplifier 204. As will be described below, the controller 202 includes circuitry and logic that allows the controller 202 to pre-charge the capacitors 212 and 216, so that the turn on time of the current mirrors within the power amplifier 204 is minimized.

Various control signals are supplied to the controller 202 via connection 132. A radio frequency (RF) input signal (RFIn) is supplied to the power amplifier 204 via connection 184. An RF output signal (RFOut) is supplied from the power amplifier 204 via connection 156.

Figure 3:
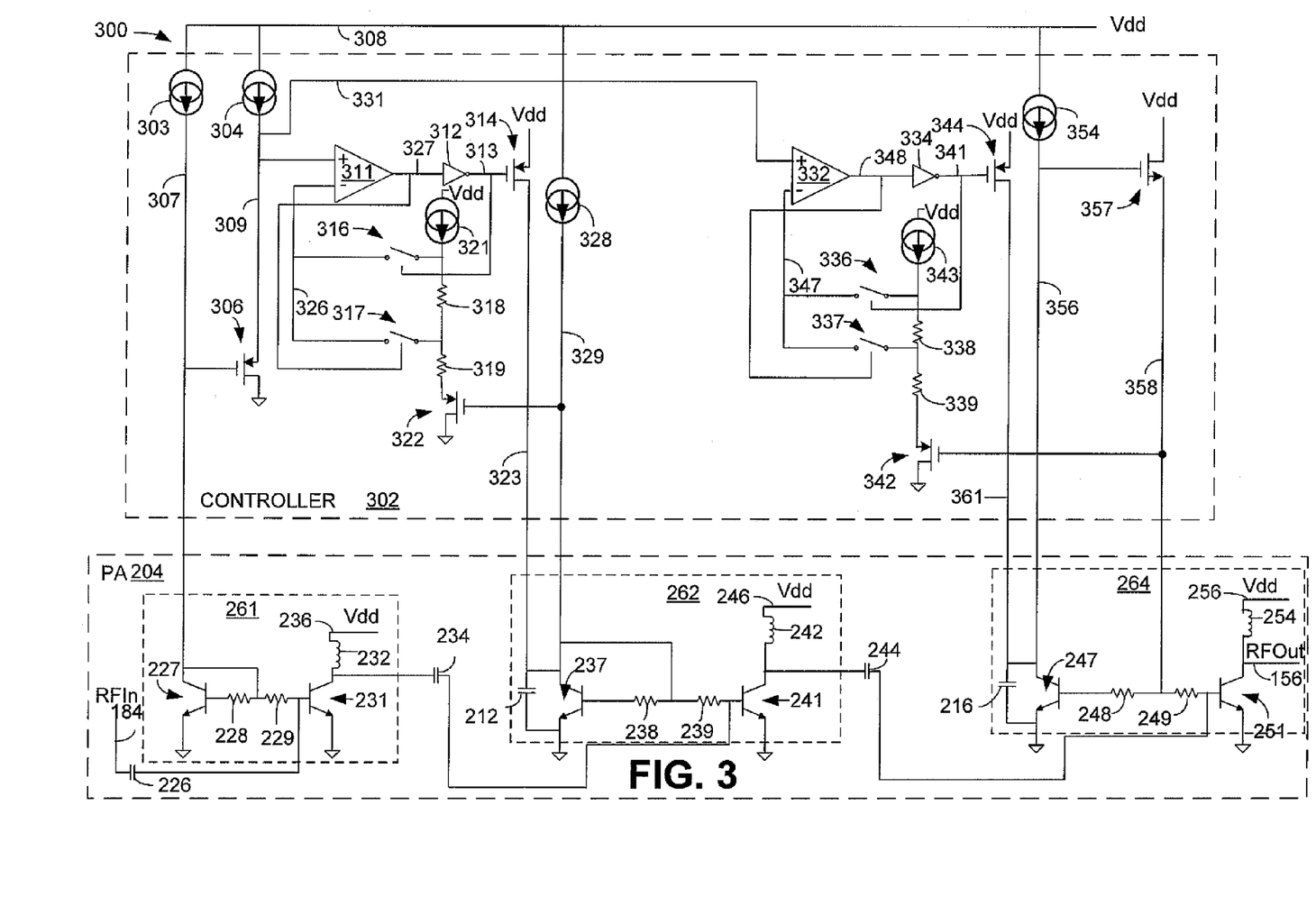
FIG. 3 is a schematic diagram illustrating an embodiment of the portions of the power amplifier module of FIG. 2.

FIG. 3 is a schematic diagram illustrating an embodiment of the portions of the power amplifier module of FIG. 2. The embodiment shown in FIG. 3 includes an embodiment of the controller and power amplifier of FIG. 2. In FIG. 3, the controller 302 includes current sources 303, 304, 321, 328, 343 and 354 coupled to a voltage supply on connection 308. The current sources 303, 304, 321, 328, 343 and 354 are illustrated to show the flow of current in their respective connections.

The controller 302 includes a transistor 306 having a gate coupled to the base of a current mirror 261 located in the power amplifier 204. The controller 302 also includes a transistor 322 having a gate connected to the base of the current mirror 262, and the controller 302 includes a transistor 342 having a gate connected to the base of the current mirror 264. These current mirror/amplifier stages will be referred to below as current mirrors. The transistors 306, 322 and 342 are illustrated as field effect transistor (FET) devices. However, other transistor device technologies may be employed.

In this embodiment, the power amplifier 204 includes current mirrors/amplifier stages 261, 262 and 264. The current mirror 261 includes transistors 227 and 231 coupled together via resistances 228 and 229. The RF input signal is supplied via connection 184, through a capacitor 226 to the base of the transistor 231. The collector of the transistor 231 is coupled through an inductance 232 to a voltage source 236. The current mirror 261 forms a first stage of the power amplifier 204.

The current mirror 262 includes transistors 237 and 241 coupled together via resistances 238 and 239. The RF output of the current mirror 261 is supplied from the collector of the transistor 231 through the capacitance 234 to the base of the transistor 241. The collector of the transistor 241 is connected through an inductance 242 to a voltage source 246. The current mirror 262 forms a second stage of the power amplifier 204. The current mirror 262 also includes a relatively large capacitance 212 coupled between the collector and the emitter of the transistor 237.

The current mirror 264 includes transistors 247 and 251 coupled together via resistances 248 and 249. The RF output of the current mirror 262 is supplied from the collector terminal of the transistor 241 through the capacitance 244 to the base of the transistor 251. The RF output signal of the power amplifier 204 is provided from the collector terminal of the transistor 251 via connection 156. The collector terminal of the transistor 251 is also coupled through the inductance 254 to a voltage source 256. The voltage sources on connections 236, 246 and 256 can be regulated voltages or can be supply voltages. The current mirror 264 forms a third and final stage of the power amplifier 204. The current mirror 264 also includes a relatively large capacitance 216 coupled between the collector and the emitter of the transistor 247. Because the current supplied via connections 329 and 356 must charge these large capacitances in order to bias the respective current minors, the large capacitances 212 and 216 extend the turn on time of the current mirrors with which they are associated. The resistances 228, 229, 238, 239, 248 and 249 may be omitted in certain applications.

In accordance with an embodiment of the system and method for pre-charging a current mirror, the controller 302 includes a comparator 311, an inverter 312, a transistor 314, switches 316 and 317, resistances 318 and 319, and transistor 322. The transistor 314 is controlled to provide a large supplemental charging current on connection 323 to quickly charge the capacitance 212 associated with the current mirror 262 in addition to the current supplied on connection 329. Similarly, the controller 302 includes a comparator 332, an inverter 334, a transistor 344, switches 336 and 337, resistances 338 and 339, and transistor 342. The transistor 344 is controlled to provide a large supplemental charging current on connection 361 to quickly charge the capacitance 216 associated with the current mirror 264 in addition to the current supplied on connection 356.

The transistors shown in the current mirrors 261, 262 and 264 are illustrated as bipolar junction transistor (BJT) devices. However, other transistor technologies can be employed within the power amplifier 204. Further, while three power amplifier stages are shown in FIG. 3, more or fewer power amplifier stages may be implemented. For example, a single current mirror and reference voltage may be implemented to take advantage of the system and method for pre-charging a current mirror.

The transistor 306 samples the voltage between the resistors 228 and 229 of the current mirror 261, i.e., the base of the current mirror 261, and provides a reference voltage signal to the non-inverting input of the comparator 311 via connection 309. This reference voltage can also be produced on the same die independent of the amplifier stage lineup, or on an independent die of the same type. The current mirror and the reference device should be fabricated using the same process (CMOS, BJT, HBT, etc.) and at similar temperature to track process and temperature variations. The output of the comparator 311 is supplied via connection 327 to the inverter 312. The output of the inverter 312 is supplied via connection 313 to the gate of the transistor 314. In this example, the transistor 314 is a P-type FET device that provides a supplemental charging current via connection 323 to charge the capacitance 212. However the transistor 314 can be an alternative device. The duration of the supplemental current provided by the transistor 314 is determined by the switches 316 and 317, and the resistances 318 and 319. The amount of additional current provided by the transistor 314 is determined by the size of the transistor 314.

In an embodiment, the voltage drop across resistor 319 provides a low offset voltage (which in an embodiment can be on the order of 150 mV offset, but which may be in the range of approximately 100-200 mV) and the voltage drop across resistors 318 and 319 provides a high offset voltage (which in an embodiment can be on the order of 350 mV offset, but which may be in the range of approximately 300-500 mV), where the switches 317 and 316 provide this offset voltage signal to the inverting input of the comparator 311 and are controlled by the signals on connections 327 and 313, respectively. The low offset voltage and the high offset voltage form voltage thresholds between which the additional current is provided to charge the capacitor 212. The transistor 322 samples the voltage between the resistors 238 and 239 of the current mirror 262, i.e., the base of the current mirror 262, so that an additional charging current can be supplied to the capacitance 212 by the transistor 314 during the time when the voltage on connection 326 is between the high and low offset values.

Similarly, the transistor 306 samples the voltage between the resistors 228 and 229 of the current mirror 261, i.e., the base of the current mirror 261, and provides a reference signal to the non-inverting input of the comparator 332 via connection 331. The output of the comparator 332 is supplied via connection 348 to the inverter 334. The output of the inverter 334 is supplied via connection 341 to the gate of the transistor 344. In this example, the transistor 344 is a P-type FET device that provides a supplemental charging current via connection 361 to charge the capacitance 216. However the transistor 344 can be an alternative device. The duration of the additional current provided by the transistor 344 is determined by the switches 336 and 337, and the resistances 338 and 339. The amount of additional current provided by the transistor 344 is determined by the size of the transistor 344. The additional current is provided to pre-charge the capacitors 212 and 216 when the reference voltage is greater than the base voltage of the current mirror by approximately 350 mV, in this embodiment. This prevents the supplemental charging current from activating during normally biased operation.

In an embodiment, the voltage drop across resistor 339 provides a low offset voltage (which in an embodiment can be on the order of 150 mV offset, but which may be in the range of approximately 100-200 mV) and the voltage drop across the resistors 338 and 339 provides a high offset voltage (which in an embodiment can be on the order of 350 mV offset, but which may be in the range of approximately 300-500 mV), where the switches 337 and 336 provide this offset voltage signal to the inverting input of the comparator 332, and are controlled by the signals on connections 348 and 341, respectively. The transistor 342 samples the voltage between the resistors 248 and 249 of the current mirror 264, i.e., the base of the current mirror 264, so that an additional charging current can be supplied to the capacitance 216 by the transistor 344 during the time when the voltage on connection 347 is between the high and low offset values.

Figure 4:
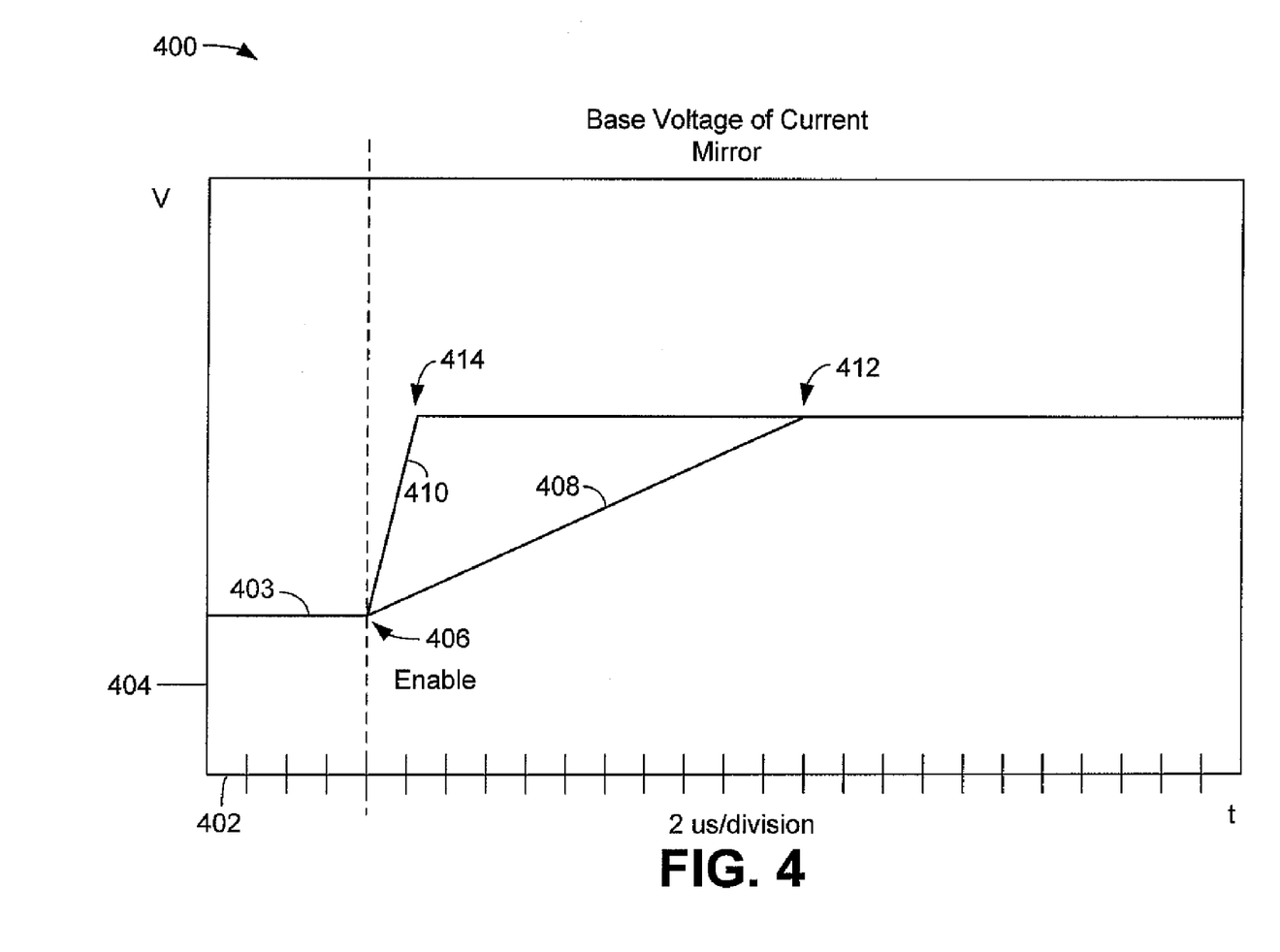
FIG. 4 is a graphical illustration showing the effect of the system and method for pre-charging a current mirror described above.

FIG. 4 is a graphical illustration 400 showing the effect of the system and method for pre-charging a current mirror described above. The horizontal axis 402 represents time (in microseconds (μs)) and the vertical axis 404 represents voltage. The trace 403 represents the base voltage of one of the current mirrors 262 or 264 (FIG. 3) prior to being enabled. The absolute value of the voltage is not shown because it may vary depending upon implementation. In this embodiment, and for example purposes only, the horizontal axis 402 is divided in 2 μs divisions. At time 406, which represents an activation or enable signal being applied to the power amplifier 204, the trace 408 represents the ramp-up of the base voltage of one of the current mirrors 262 or 264 when no pre-charging current is supplied to the current mirror. The trace 410 represents the ramp-up of the base voltage of one of the current mirrors 262 or 264 when a pre-charging current is supplied to the current mirror. As shown, when no pre-charging current is supplied to the current mirror, an approximate 22 μs duration is required from the activation time to the time that the current mirror is fully biased, as shown at point 412. In accordance with an embodiment of the system and method for pre-charging a current mirror, the trace 410 indicates that when a pre-charging current is provided by the controller 302, the base of the current mirror charges in approximately 2.2 μs, as shown at point 414. Therefore, providing the additional charging current from the controller 302 to the power amplifier 204 significantly reduces the turn on time of the power amplifier 204.

Figure 5:
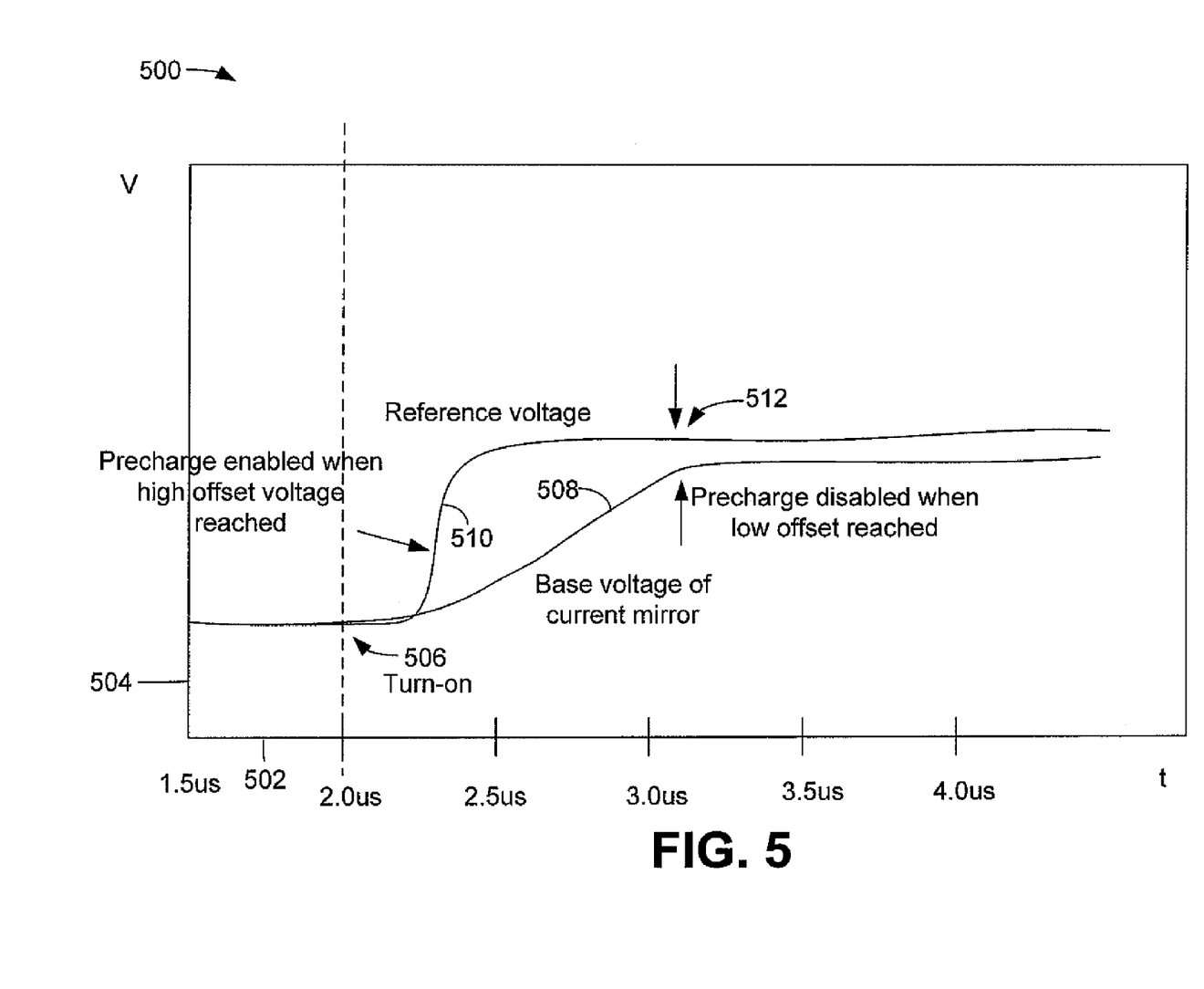
FIG. 5 is a graphical illustration showing the enabling and disabling of the pre-charge current described in FIG. 3.

FIG. 5 is a graphical illustration 500 showing the enabling and disabling of the pre-charge current described in FIG. 3. The horizontal axis 502 represents time (in μs) and the vertical axis 504 represents voltage. At a time 506 the current mirror is activated. The trace 510 represents the reference voltage (307 in FIG. 3) provided by the current mirror 261. The pre-charge current is enabled when the high offset voltage is reached (i.e., when the reference voltage on connection 307 in FIG. 3 is higher then the base voltage of the current mirror 262 or 264 by the high offset voltage, which is approximately 350 mV, in this embodiment). This occurs quickly as there is only parasitic capacitance (not shown) to charge. This is represented in FIG. 5 as the offset between the trace 508 and the trace 510. The trace 508 represents the base voltage of the current mirrors 262 or 264. The point 512 represents the time when the pre-charge current is disabled.

The high offset voltage prevents the additional pre-charging current from inadvertently activating during normal circuit operation when the bases of the current mirrors 262 or 264 should be within the high offset voltage of the reference voltage 307, which is approximately 350 mV, in this embodiment. When the bases of the current mirrors 262 and 264 are within the low offset voltage of the reference voltage 307, approximately 150 mV in this embodiment, the additional pre-charging current is disabled to prevent over-charging the base voltage of the current mirrors.

Figure 6:
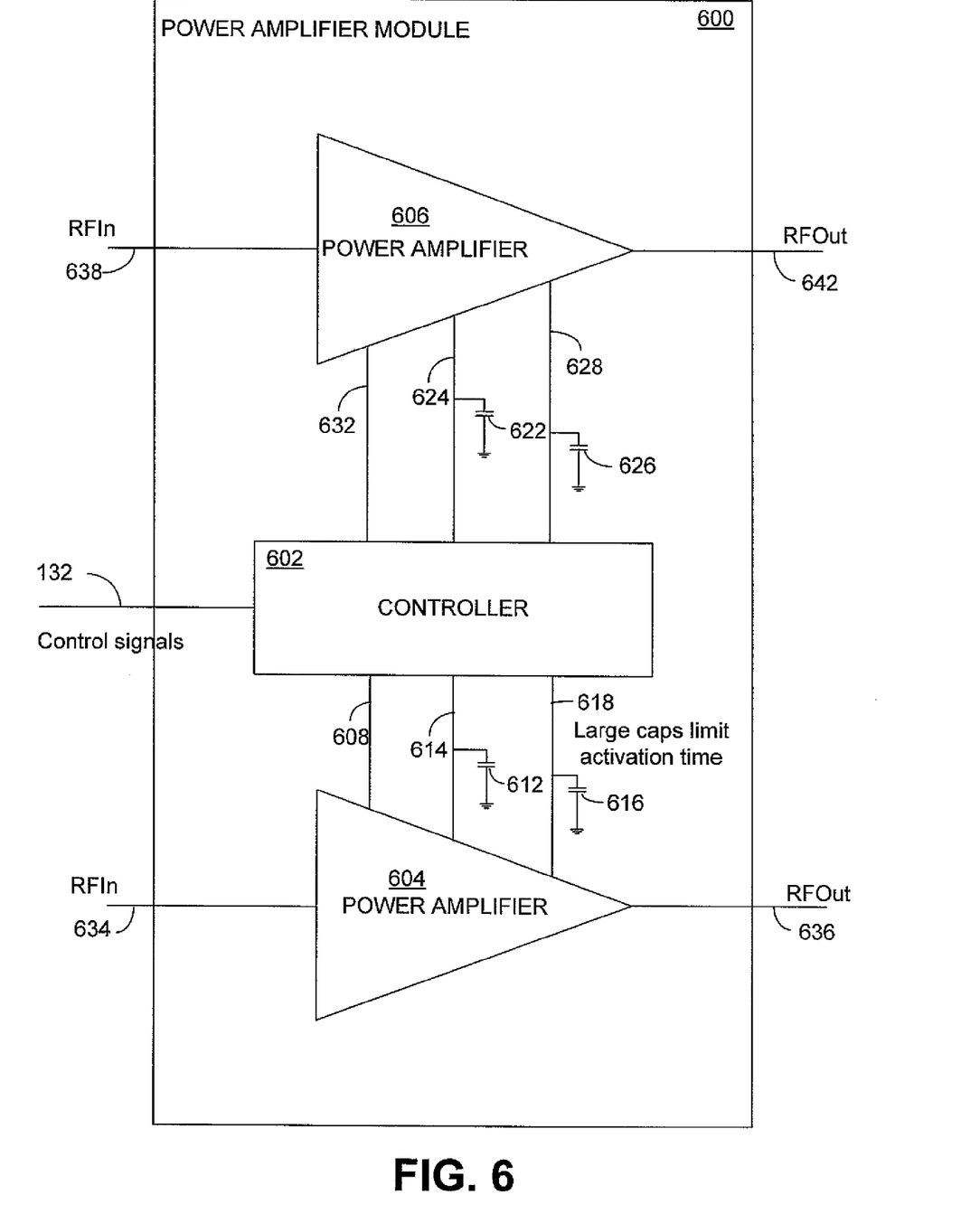
FIG. 6 is a block diagram illustrating an alternative embodiment of the power amplifier module of FIG. 1.

FIG. 6 is a block diagram illustrating an alternative embodiment of the power amplifier module of FIG. 1. The power amplifier module is referred to using reference numeral 600 in FIG. 6. The power amplifier module 600 is illustrated to explain the system and method for pre-charging a current mirror and may include other elements (not shown). The power amplifier module 600 includes a controller 602 and two power amplifiers 604 and 606. A reference voltage is provided from the power amplifier 604 to the controller 602 via connection 608 to pre-charge current mirrors in the power amplifier 606 or from the power amplifier 606 to the controller 602 via connection 632 to the pre-charge current mirrors in the power amplifier 604. This reference voltage can also be produced on the same die independent of the amplifier stage lineup, or on an independent die of the same type. The current mirror and the reference should be fabricated using the same process (CMOS, BJT, HUT, etc.) and at similar temperature to track process and temperature variations. The connections 608, 614 and 618 between the controller 602 and the power amplifier 604, and the connections 632, 624 and 628 between the controller 602 and the power amplifier 606, illustrate the connections between the controller 602 and multiple iterations of the power amplifiers 604 and 606. Further, each of the power amplifiers 604 and 606 will typically include multiple stages.

In this example, large capacitances 612 and 616, associated with the power amplifier 604, and large capacitances 622 and 626, associated with the power amplifier 606 limit the turn on time of the current mirrors within the power amplifiers 604 and 606, respectively. As will be described below, the controller 602 includes circuitry and logic that allows the controller 602 to pre-charge the capacitors 612, 616, 622 and 626, so that the turn on time of the current mirrors within the power amplifiers 604 and 606 is minimized.

Various control signals are supplied to the controller 602 via connection 132. A radio frequency (RF) input signal (RFIn) is supplied to the power amplifier 604 via connection 634 and to the power amplifier 606 via connection 638. An RF output signal (R-FOut) is supplied from the power amplifier 604 via connection 636 and from the power amplifier 606 via connection 642. The input signals on connections 634 and 638 are separate and independent instances of the output of the transmitter 150 of FIG. 1 and the output signals on connections 636 and 642 are separate and independent instances of the output of the power amplifier module 180 to the front end module 162.

Figure 7:
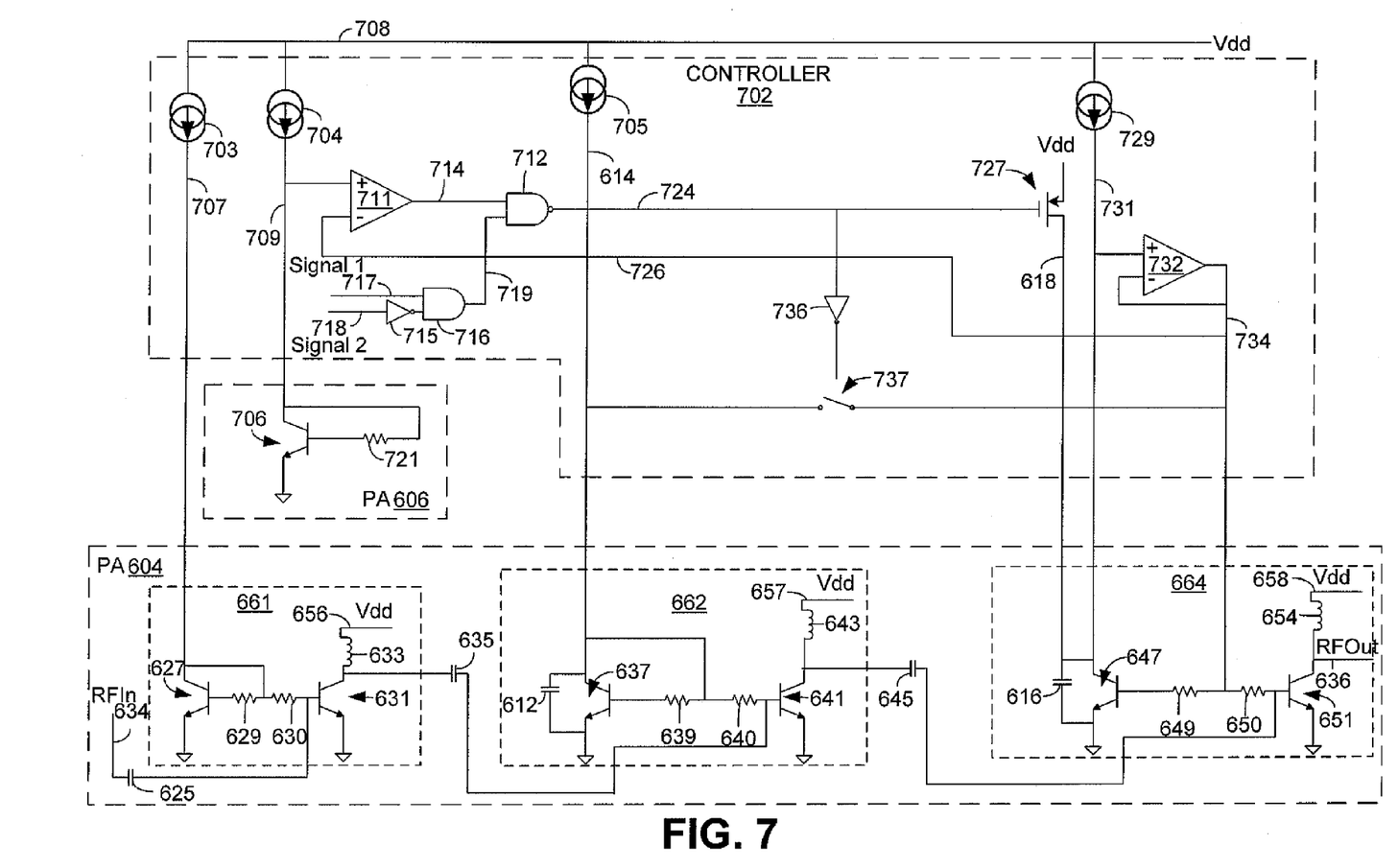
FIG. 7 is a schematic diagram illustrating an alternative embodiment of a system and method for pre-charging a current mirror.

FIG. 7 is a schematic diagram illustrating an alternative embodiment of a system and method for pre-charging a current mirror. The controller 702 includes current sources 703, 704, 705 and 729 connected to a voltage source via connection 708. A transistor 706 and a resistor 721 provide a reference voltage level to a non-inverting input of a comparator 711 via connection 709. The output of the comparator 711 is provided via connection 714 to a NAND gate 712. An AND gate 716 is configured to receive a first signal on connection 717 and a second signal on connection 718 via an inverter 715. The signals on connections 717 and 718 will be described below. The output of the AND gate 716 is supplied via connection 719 to the other input of the NAND gate 712. The output of NAND gate 712 is provided via connection 724 to a transistor 727. The transistor 727 provides a supplemental charging current via connection 618 to quickly charge the capacitance 616 associated with the current mirror 664. The transistor 727 may be implemented as a P-type FET, or may be implemented as an alternative device.

The power amplifier 604 includes a current mirror 661, a current mirror 662 and a current mirror 664. These current mirror/amplifier stages will be referred to below as current mirrors. The current mirror 661 includes transistors 627 and 631 connected together via resistances 629 and 630. The RF input signal is supplied via connection 634 through capacitance 625 to the base of the transistor 631. The collector of the transistor 631 is coupled through an inductance 633 to a voltage source 656.

The current mirror 662 includes transistors 637 and 641 coupled together via resistances 639 and 640. The RF output of the current mirror 661 is provided via capacitance 635 to the base of the transistors 641. The collector of the transistor 641 is connected through an inductance 643 to a voltage source 657. A large capacitance 612 is located across the collector and the emitter of the transistor 637 associated with the current mirror 662.

The current mirror 664 includes transistors 647 and 651 coupled together via resistances 649 and 650. The RF output of the current mirror 662 is provided through the capacitance 645 to the base of the transistor 651. The RF output of the power amplifier 604 is provided via connection 636. The voltage sources on connections 656, 657 and 658 can be regulated voltages or can be power supply voltages. The resistances 629, 630, 639, 640, 649, 650 and 721 may be omitted in certain applications.

The controller 702 also includes an operational amplifier 732. The operational amplifier 732 has its non-inverting input connected via connection 731 to a current source 729. The output of the operational amplifier 732 on connection 734 is also supplied to the inverting input of the operational amplifier 732. The output of the operational amplifier 732 on connection 734 is also provided via connection 726 to the inverting input of the comparator 711. An inverter 736 receives its input from connection 724 to control the switch 737. The capacitance 616 is pre-charged via the transistor 727. The operational amplifier 732 provides a bias voltage for the current mirror 664. The operational amplifier 732 provides the base current to the transistors 647 and 651 as the base current of the transistor 651 is large and would reduce the reference current into the transistor 647, changing the effective current mirror ratio. The operational amplifier 732 provides a similar function as what is referred to as a "beta helper" without the base-to-emitter ($V_{BE}$) voltage drop. The switch 737 connects the bases of the current mirrors 662 and 664 to the operational amplifier 732 in pre-charge mode, charging the capacitances 612 and 616 until the base of the current mirror 664 equals the reference voltage on connection 709. This brings the base voltage of the current mirrors 662 and 664 to approximately the desired voltage. When the pre-charge of the capacitors 612 and 616 is complete, the switch 737 opens and the transistor 727 turns off allowing the current mirrors 662 and 664 to settle to their respective bias points.

In this embodiment, the reference voltage provided by the transistor 706 to the comparator 711 via connection 709 is provided from the power amplifier 606 (FIG. 6) and is independent of the power amplifier 604. In this example the reference voltage is the current mirror reference for the first stage of a different power amplifier (i.e. the current mirror 661, but in power amplifier 606.). This allows both variations in process and temperature to be tracked. The reference voltage can also be produced on the same die independent of the amplifier stage lineup, or on an independent die of the same type. The current mirror and the reference should be fabricated using the same process (CMOS, BJT, HBT, etc.) and at similar temperature to track process and temperature variations.

Turning off the first stage (i.e. the current mirror 661) of the power amplifier 604 provides for improved RF isolation. During the time when the current mirror 661 is off, there is a small RF gain through the power amplifier. This first stage can be turned on quickly as, in this case, there is only small parasitic capacitance (not shown) to charge. This improved isolation can be in addition to isolation provided typically in an RF switch.

Figure 8:
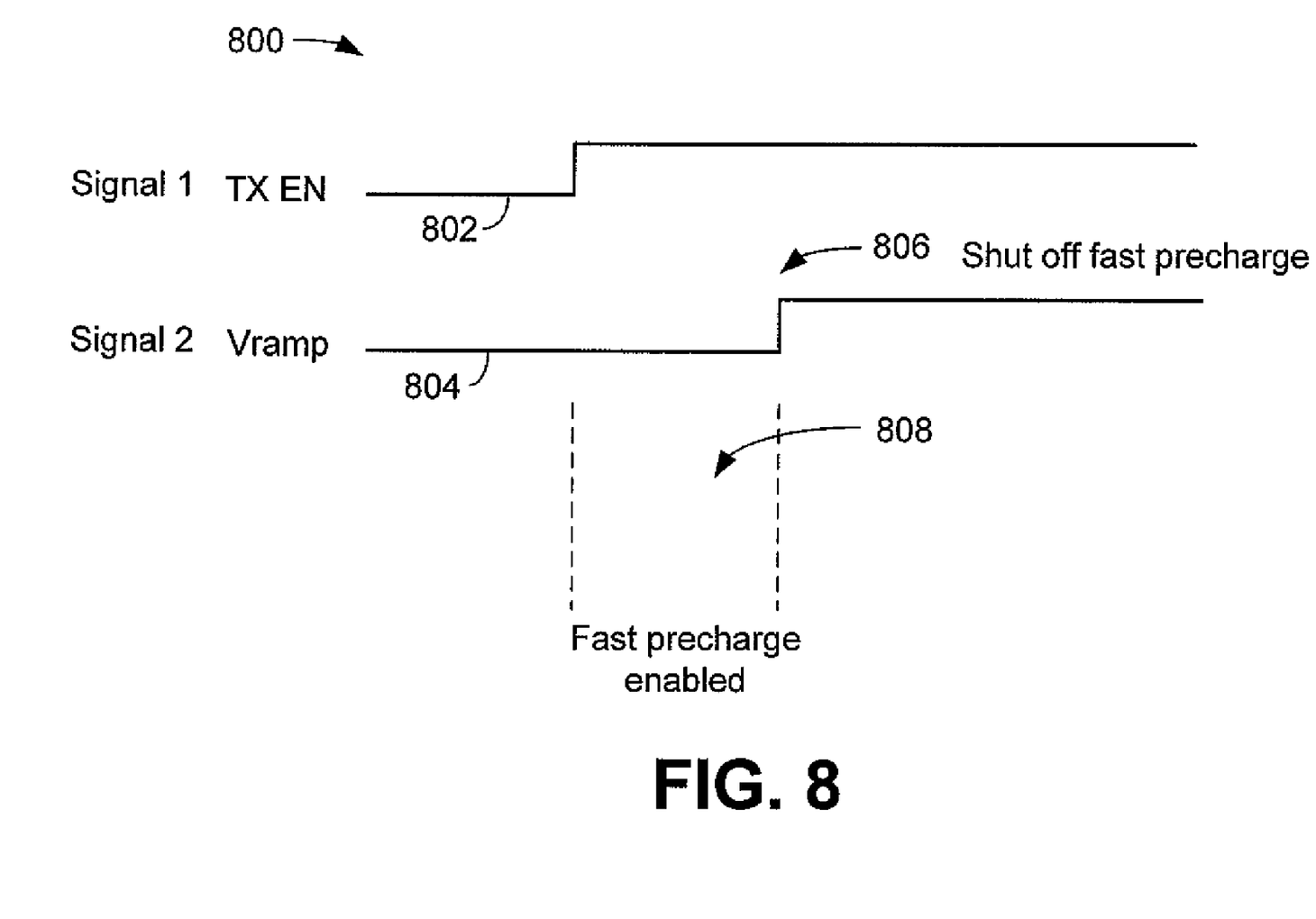
FIG. 8 is a graphical view illustrating the signals that control the pre-charge circuitry of FIG. 7.

FIG. 8 is a graphical view 800 illustrating the signals that control the pre-charge circuitry of FIG. 7. In this example, signal 1 (717 in FIG. 7) is referred to as a transmit enable (TX EN) signal and is shown using trace 802. In this example, signal 2 (718 in FIG. 7) is referred to as a Vramp signal and is shown using trace 804. The Vramp signal is generated by an analog control voltage that has been compared to another reference voltage (for example, in this embodiment, a 300 mV reference voltage). If the analog control voltage is greater than 300 mV then the Vramp signal is logic high. During a typical timing sequence, the TX EN signal shown by trace 802 enables the transistor 727, the operational amplifier 732 and the switch 737 (FIG. 7) to start pre-charging during the time period 808 because Vramp is typically low at this time. When the Vramp signal shown by trace 804 becomes logic high, pre-charging using the transistor 727, the operational amplifier 732 and the switch 737 is disabled at point 806. Pre-charge is typically active when the voltage on connection 709 (FIG. 7) is greater than the voltage on connection 734 (FIG. 7) and when the signal TX_EN is logic high and the Vramp signal is logic low.

Figure 9:
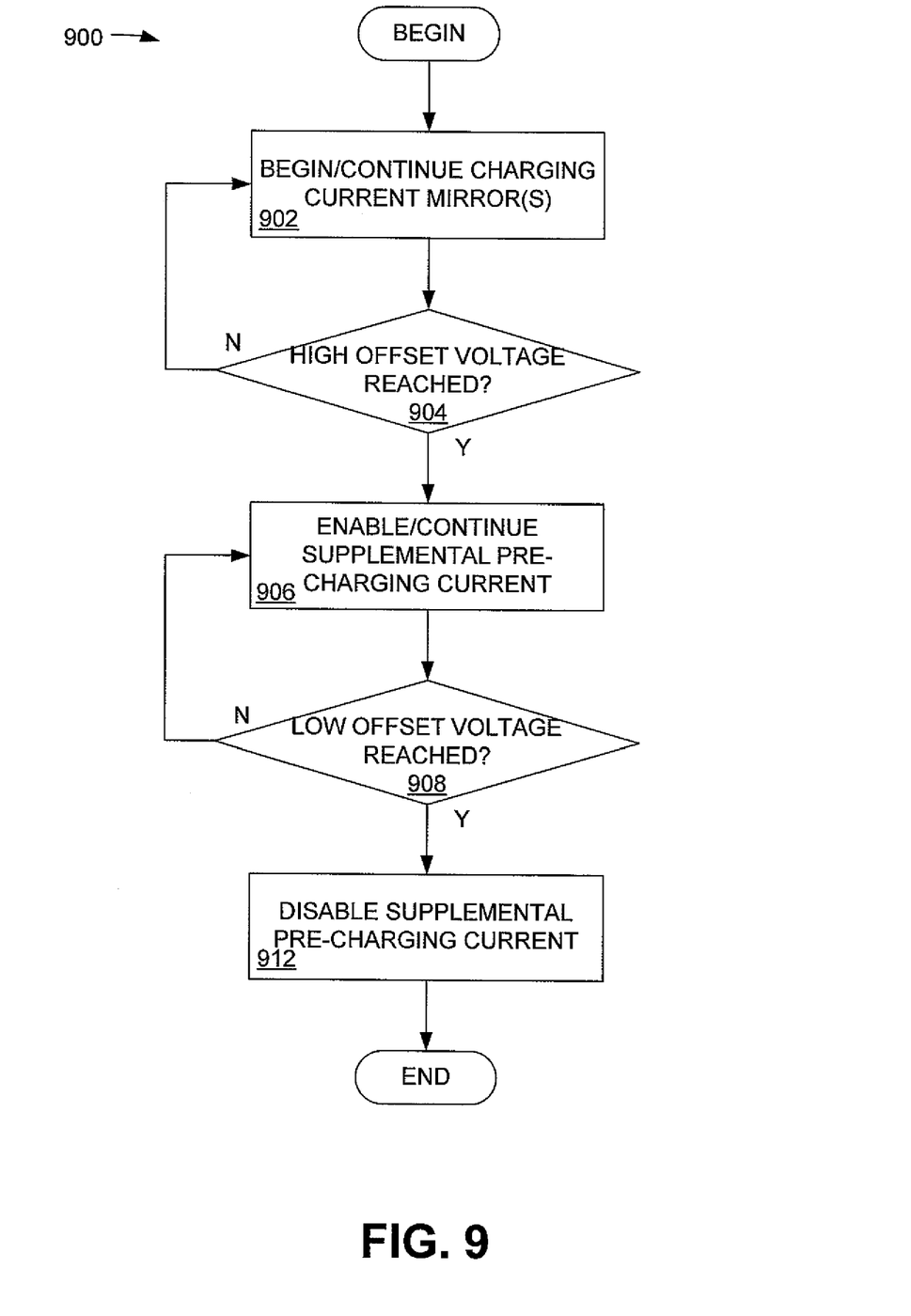
FIG. 9 is a flow chart describing the operation of an embodiment of the system and method for pre-charging a current mirror of FIG. 2 and FIG. 3.

FIG. 9 is a flow chart describing the operation of an embodiment of the system and method for pre-charging a current mirror of FIG. 2 and FIG. 3. Each current mirror described above is independently pre-charged. The steps in the flow chart can be performed in or out of the order shown. The flow chart 900 generally describes the operation of the embodiment shown in FIG. 3. In block 902, the controller 302 (FIG. 3) begins charging the current mirrors in the power amplifier 204 (FIG. 3). In block 904, it is determined whether the high offset voltage is reached. If the high offset voltage is not reached, the process returns to block 902 where the controller 302 continues charging the current mirrors in the power amplifier 204. If the high offset voltage is reached, then, in block 906, the controller 302 (FIG. 3) enables the supplemental charging current via connections 323 (FIG. 3) and/or 361 (FIG. 3).

In block 908, it is determined whether the low offset voltage is reached. If the low offset voltage is not reached, the process returns to block 906 where the controller 302 continues pre-charging the current mirror in the power amplifier 204 using the supplemental current. If the low offset voltage is reached, then, in block 912, the controller 302 (FIG. 3) disables the supplemental charging current on connections 323 (FIG. 3) and/or 361 (FIG. 3).

Figure 10:
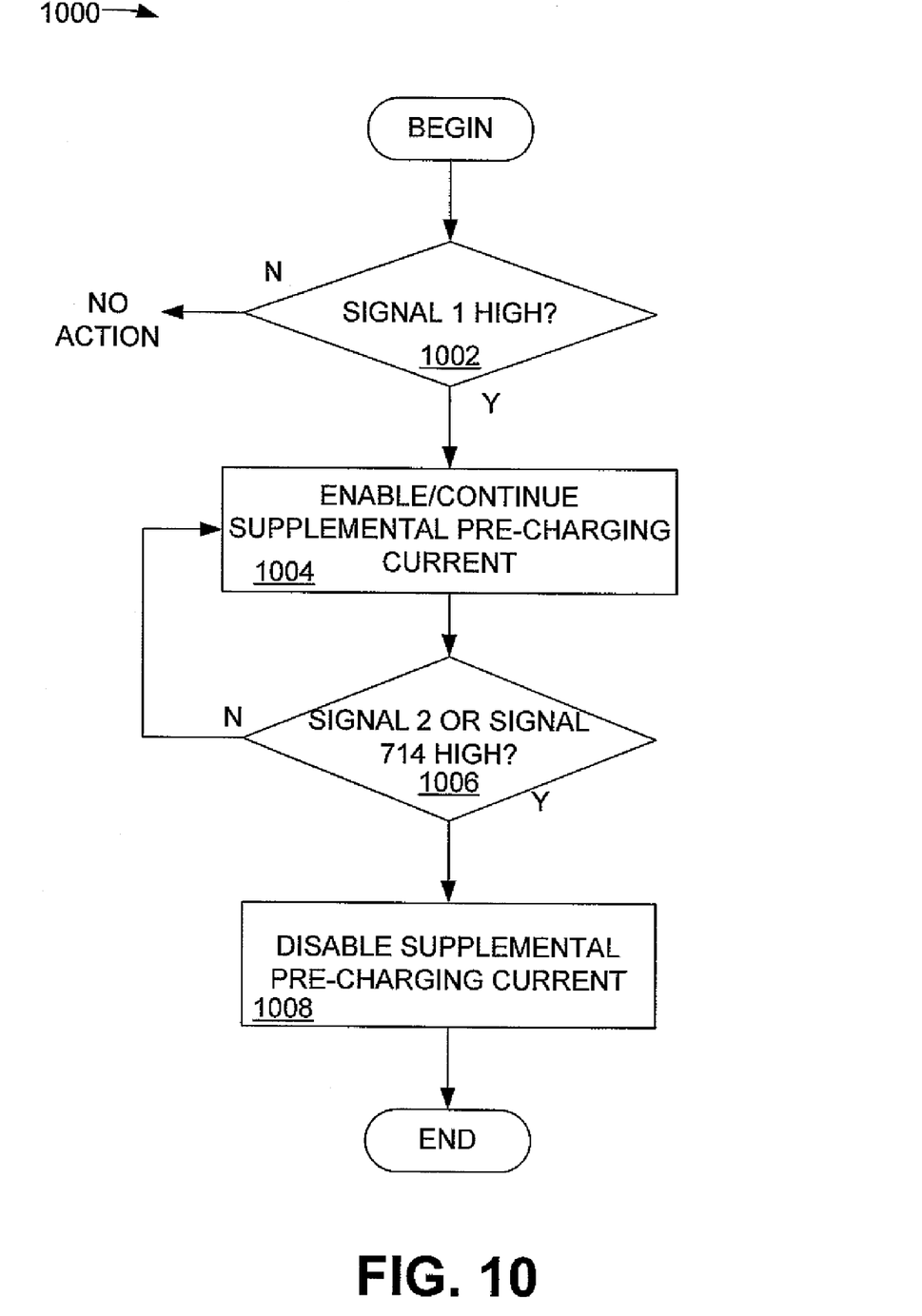
FIG. 10 is a flow chart describing the operation of an alternative embodiment of the system and method for pre-charging a current mirror of FIG. 6, FIG. 7 and FIG. 8.

FIG. 10 is a flow chart describing the operation of an alternative embodiment of the system and method for pre-charging a current mirror of FIG. 6, FIG. 7 and FIG. 8. The steps in the flow chart can be performed in or out of the order shown. The flow chart 1000 generally describes the operation of the embodiment shown in FIG. 7. In block 1002, it is determined whether the signal 1 is logic high. If the value of the signal 1 is not logic high, then no action is taken. If the value of the signal 1 is logic high, then, in block 1004, the controller 702 (FIG. 7) enables the supplemental charging current via connection 618 (FIG. 7) and switch 737 closes, thus charging node 614 through the operational amplifier 732.

In block 1006, it is determined whether the value of the signal 2 or the signal on connection 714 is logic high. If the value of the signal 2 or the signal on connection 714 is not logic high, the process returns to block 1004 where the controller 702 continues pre-charging the current mirrors 662 and 664 in the power amplifier 604 using the supplemental current. If the value of the signal 2 or the signal on connection 714 is logic high, ten, in block 1008, the controller 702 (FIG. 7) disables the supplemental charging current on connection 618 and switch 737 opens, disabling the supplemental charging current on node 614. The current mirrors 662 and 664 then settle at their normal operating point.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A system for pre-charging a current minor, comprising:
   a controller configured to provide a first current and an additional current to a current mirror to rapidly charge a capacitance coupled to the current mirror, wherein the controller applies the additional current in response to a reference voltage; and
   logic configured to provide the additional current to the current minor when a base voltage of the current minor is less than the reference voltage, the logic comprising a comparator and at least one logic gate, responsive to two control signals, the two control signals defining a time period during which the additional current is provided.

2. The system of claim 1, in which the comparator is configured to receive the reference voltage and a current minor representative signal.

3. The system of claim 2, in which the representative signal is developed using the base voltage of the current minor.

4. The system of claim 3, in which the additional current is provided when the reference voltage is greater than the base voltage of the current mirror by approximately 350 mV.

5. The system of claim 4, in which the additional current is disabled when the base voltage of the current mirror is within a low offset voltage value with respect to the reference voltage.

6. The system of claim 1, in which a first current mirror is charged through a transistor device and a second current mirror is charged through an operational amplifier and a switch.

7. A power amplifier module, comprising:
   a power amplifier comprising at least one current mirror;
   a controller configured to provide a first current and an additional current to the at least one current mirror to rapidly charge a capacitance coupled to the at least one current mirror, wherein the controller applies the additional current in response to a reference voltage; and
   logic configured to provide the additional current to the current mirror when a base voltage of the current mirror is less than the reference voltage, the logic comprising a comparator and at least one logic gate responsive to two control signals, the two control signals defining a time period during which the additional current is provided.

8. The power amplifier module of claim 7, in which the logic further comprises a comparator configured to receive the reference voltage and a current mirror representative signal.

9. The power amplifier module of claim 8, in which the representative signal is developed using the base voltage of the current mirror.

10. The power amplifier module of claim 9, in which the additional current is provided when the reference voltage is greater than the base voltage of the current mirror by approximately 350 mV.

11. The power amplifier module of claim 10, in which the additional current is disabled when the base voltage of the current mirror is within a low offset voltage value with respect to the reference voltage.

12. The power amplifier module of claim 7, further comprising a first current mirror stage and a second current mirror stage, and in which disabling a first current mirror stage improves radio frequency isolation of the power amplifier.

13. A method for pre-charging a current mirror, comprising:
providing a first current to a current mirror;
providing an additional current to the current mirror to rapidly charge a capacitance coupled to the current mirror, wherein the additional current is applied in response to a reference voltage; and
providing the additional current to the current mirror in response to at least two control signals, the two control signals defining a time period during which the additional current is provided.

14. The method of claim 13, further comprising providing the additional current to the current mirror when a base voltage of the current mirror is less than the reference voltage.

15. The method of claim 14, further comprising:
providing the reference voltage to a comparator; and
providing a current mirror representative signal to the comparator.

16. The method of claim 15, further comprising developing the current mirror representative signal using the base voltage of the current mirror.

17. The method of claim 16, in which the additional current is provided when the reference voltage is greater than the base voltage of the current mirror by approximately 350 mV.

18. The method of claim 17, further comprising disabling the additional current when the base voltage of the current mirror is within a low offset voltage value with respect to the reference voltage.

* * * * *